US008283759B2

(12) United States Patent
Oida et al.

(10) Patent No.: US 8,283,759 B2
(45) Date of Patent: Oct. 9, 2012

(54) LEAD FRAME HAVING OUTER LEADS COATED WITH A FOUR LAYER PLATING

(75) Inventors: Seishi Oida, Kyoto (JP); Takahiro Nakano, Kyoto (JP); Yoshito Miyahara, Nagano (JP); Takashi Yoshie, Nagano (JP); Harunobu Satou, Nagano (JP); Kouichi Kadosaki, Nagano (JP); Kazumitsu Seki, Nagano (JP)

(73) Assignees: Panasonic Corporation, Osaka (JP); Shinko Electric Industries Co., Ltd., Nagano (JP)

( * ) Notice: Subject to any disclaimer, the term of this patent is extended or adjusted under 35 U.S.C. 154(b) by 465 days.

(21) Appl. No.: 11/582,972

(22) Filed: Oct. 19, 2006

(65) Prior Publication Data
US 2007/0090501 A1  Apr. 26, 2007

(30) Foreign Application Priority Data
Oct. 20, 2005  (JP) .................. 2005-306379

(51) Int. Cl.
H01L 23/495 (2006.01)
H01L 21/00 (2006.01)
(52) U.S. Cl. ............ 257/676; 257/762; 257/E33.066; 257/E23.031; 257/E23.053; 257/E23.06; 438/123
(58) Field of Classification Search .............. None
See application file for complete search history.

(56) References Cited

U.S. PATENT DOCUMENTS

| 5,014,113 | A | * | 5/1991 | Casto | 257/674 |
| 5,360,991 | A | * | 11/1994 | Abys et al. | 257/666 |
| 5,436,082 | A | * | 7/1995 | Mathew | 428/670 |
| 5,650,661 | A | * | 7/1997 | Mathew | 257/677 |
| 5,994,767 | A | * | 11/1999 | Huang et al. | 257/666 |
| 6,150,711 | A | * | 11/2000 | Kom et al. | 257/677 |
| 6,245,448 | B1 | * | 6/2001 | Abbott | 428/670 |
| 6,891,253 | B2 | | 5/2005 | Miyaki et al. | |
| 7,148,085 | B2 | * | 12/2006 | Abbott et al. | 438/123 |
| 7,250,671 | B2 | * | 7/2007 | Lee et al. | 257/669 |
| 7,329,944 | B2 | * | 2/2008 | Seki et al. | 257/666 |
| 7,397,114 | B2 | * | 7/2008 | Miyaki et al. | 257/677 |
| 7,692,277 | B2 | * | 4/2010 | Tomohiro et al. | 257/677 |
| 2002/0047186 | A1 | | 4/2002 | Tellkamp | |
| 2002/0104682 | A1 | * | 8/2002 | Park et al. | 174/255 |
| 2003/0011048 | A1 | | 1/2003 | Abbott et al. | |
| 2003/0121959 | A1 | | 7/2003 | Yamaguchi et al. | |
| 2004/0155336 | A1 | | 8/2004 | Yamaguchi et al. | |

(Continued)

FOREIGN PATENT DOCUMENTS
DE   198 50 526 A1   11/1998
(Continued)

OTHER PUBLICATIONS

European Search Report issued in European Patent Application No. EP 06 122 491.1, mailed Oct. 16, 2008.

(Continued)

*Primary Examiner* — Alonzo Chambliss
(74) *Attorney, Agent, or Firm* — McDermott Will & Emery LLP

(57) ABSTRACT

A lead frame base is coated with a four-layer plating. The four-layer plating includes an underlayer plating (Ni), a palladium plating, a silver plating and a gold plating arranged in this order from bottom to top.

13 Claims, 7 Drawing Sheets

U.S. PATENT DOCUMENTS

| | | |
|---|---|---|
| 2004/0262719 A1 | 12/2004 | Seki et al. |
| 2005/0184366 A1* | 8/2005 | Lee et al. ............... 257/666 |
| 2006/0125073 A1* | 6/2006 | Seki et al. .............. 257/690 |

FOREIGN PATENT DOCUMENTS

| | | |
|---|---|---|
| JP | 4-115558 | 4/1992 |
| JP | 04-337657 | 11/1992 |
| JP | 09-307050 | 11/1997 |
| JP | 10-074879 | 3/1998 |
| JP | 2001-230360 | 8/2001 |
| JP | 2002-076229 | 3/2002 |
| JP | 2003-198117 | 7/2003 |
| JP | 2004-176107 | 6/2004 |
| JP | 2004-241542 | 8/2004 |
| JP | 2005-019922 | 1/2005 |
| WO | WO 99/64198 | 12/1999 |
| WO | WO 2004/064154 A1 | 7/2004 |

OTHER PUBLICATIONS

Japanese Office Action, with English translation, issued in Japanese Patent Application No. 2005-306379, dated Jun. 30, 2009.

Japanese Notice of Release of Reconsideration Before Appeal, w/ English translation thereof, issued in Japanese Patent Application No. JP 2005-306379 dated Mar. 16, 2010.

Japanese Reconsideration Report, w/ English translation thereof, issued in Japanese Patent Application No. JP 2005-306379 dated Mar. 8, 2010.

* cited by examiner

| Item | | Details |
|---|---|---|
| Package type | | LQFP216 pin, 24 mm□ (0.4 mm pitch) |
| Board | Type | FR-4, two-layer |
| | Thickness | 1.6 mm |
| Metal mask | Type | SUS (laser finished) |
| | Thickness | 0.12 mm |
| Solder paste | | Sn-3Ag-0.5Cu |

36

20  24  28

LEAD FRAME HAVING OUTER LEADS COATED WITH A FOUR LAYER PLATING

CROSS-REFERENCE TO RELATED APPLICATION

This non-provisional application claims priority under 35 U.S.C. §119(a) of Japanese Patent Application No. 2005-306379 filed in Japan on Oct. 20, 2005, the entire contents of which are hereby incorporated by reference.

BACKGROUND OF THE INVENTION

1. Field of the Invention

The present invention relates to a lead frame, in particular to a plated lead frame for use in semiconductor devices.

2. Description of Related Art

According to reduction in size and weight of small products in recent years, there is a growing demand for reduction in size and thickness of semiconductor devices. Printed circuit boards for implementing the semiconductor devices are also required to be thin, small and multilayered. In general, the semiconductor device is implemented on the printed circuit board by reflowing.

Hereinafter, explanation of problems involved in the step of reflowing the semiconductor device in a conventional manner is provided with reference to the drawings.

FIGS. 9A, 9B and 9C show how a semiconductor device is implemented on a board. Here, a semiconductor device 32 is prepared by mounting a semiconductor element on a lead frame and sealing it into a package with a mold resin 33.

First, in a solder printing step shown in FIG. 9A, solder paste 31 is applied onto electrode pads (not shown) provided on a printed circuit board (wiring board) 30. Then, in a mounting step shown in FIG. 9B, the semiconductor device 32 is mounted on the printed circuit board 30. Then, in a reflowing step shown in FIG. 9C, the whole device including the printed circuit board 30 and the semiconductor device 32 is heated at a high temperature to melt the solder paste 31. The solder paste 31 is then cooled, thereby fixing and connecting the semiconductor device 32 to the print circuit board 30.

Through these steps, outer leads 34 electrically conducted with electrode pads in the semiconductor element are electrically connected to the printed circuit board 30 via the solder paste 31. The bottommost surface of each of the outer leads 34 of the semiconductor device 32 is generally called a mounting surface 35. The outer leads 34 are configured such that coplanarity 36 indicating flatness of the mounting surface 35 as shown in FIG. 10 is in the range of several tens of μm.

In the reflowing step, the semiconductor device and the printed circuit board are deformed by various loads applied thereto while the temperature rises from a normal temperature of about 25° C. to a high temperature of about 250° C. Specifically, the semiconductor device 32 is deformed due to the difference in thermal expansion coefficient between the outer leads 34 principally made of iron or copper and the mold resin 33. If the coplanarity 36 is high, the outer leads 34 are deformed to be lifted above the printed circuit board 30.

The printed circuit board 30 which is made thin or multilayered is also deformed under the high temperature during the reflowing step. The deformation of these components synergistically causes defects, even if the mounting surfaces 35 of the outer leads 34 are in contact with the solder paste 31. For example, the solder paste 31 does not achieve good wicking, i.e., solder fillet is not formed, or alternatively, the outer leads 34 are lifted above the solder paste 31 to fail to establish electrical connection, thereby leading to solder joint open failure.

In order to prevent such defects, the surface of the lead frame is plated to improve wettability between the outer leads 34 and the solder paste 31.

In recent years, from the aspect of environment issues, lead free solder paste, such as SnAgCu, SnZn and SnAgBiIn, are used as the solder paste 31 in many cases. However, the lead free solder pastes are poorer in wettability than conventional Sn-37% Pb eutectic solder and are likely to cause the defects such as the failure in solder fillet formation and the solder joint open failure. Therefore, a plating having good wettability with the lead free solder paste is required.

When the outer leads 34 are coated with a SnPb eutectic plating having a relatively low melting point, the plating itself is molten under the high temperature condition during the reflowing step. Therefore, even if the lead free solder paste is used, the defect derived from the solder paste's lack of good wicking characteristics is less likely to occur. However, from the environmental standpoint, use of the Pb-containing plating will be restricted only in some very limited locations in electronic products. Thus, the plating of this kind is not available for general use.

When a lead free plating is used, e.g., a SnBi plating (a two-layer plating including a tin layer and a 2% Bi layer formed thereon), the SnBi plating itself is molten due to its low melting point just like the SnPb eutectic plating. Therefore, the problem of the solder paste's lack of good wicking characteristics does not occur.

Further, when a palladium-based metallic plating which has been adopted as a lead free plating by many manufacturers is used (e.g., a three-layer plating of nickel 20/palladium 24/gold 28 as shown in FIG. 11), the palladium-based metallic plating is not molten because its melting point is much higher than the high temperature condition during the reflowing step. However, the failure in solder fillet formation and the solder joint open failure have been less likely to occur even if the lead free solder paste is used. It is because the outer leads have been arranged at a pitch of 0.6 mm or more (e.g., see Japanese Unexamined Patent Publication H4-115558).

SUMMARY OF THE INVENTION

In recent years, the semiconductor device and the wiring board have been fabricated under finer design rules. Accordingly, the area of connector lands has been reduced and the area of openings in a metal mask used for solder printing has also been reduced. As a result, the solder paste does not easily come off the openings of the printing mask, thereby causing lack of the solder paste on the wiring board. Even if the printing succeeds, the total amount of the solder printed on the minuscule regions is smaller than it used to be. With the trend toward the smaller pitch, in particular when the pitch of the outer leads is reduced to less than 0.6 mm, the plated outer leads as disclosed by Japanese Unexamined Patent Publication H4-115558 bring about the failure in solder fillet formation or the solder joint open failure.

Further, while the outer leads are plated with SnBi, the inner leads are plated by Ag spot plating. This brings about considerable increase in manufacturing cost.

The present invention has been achieved under these circumstances. An object of the present invention is to provide a lead frame coated with a plating which ensures the wettability of the lead frame and the lead free solder even if the outer lead pitch is reduced.

The lead frame of the present invention includes a die pad for mounting a semiconductor element thereon, inner leads electrically connected to electrode pads of the semiconductor element and outer leads connected to the inner leads to function as external terminals, wherein at least the ends of the outer leads opposite to the inner leads are coated with a four-layer plating, first three layers in the four-layer plating from the topmost surface thereof are made of Au, Ag and Pd, respectively, and the Ag layer is not less than 0.05 μm and not more than 0.5 μm in thickness.

It is preferred that the outer leads are arranged at a pitch of not less than 300 μm and not more than 500 μm.

It is preferred that each of the outer leads is not less than 80 μm and not more than 250 μm in width.

It is preferred that the Pd layer in the four-layer plating is not less than 0.005 μm and not more than 0.2 μm in thickness.

It is preferred that the Au layer in the four-layer plating not less than 0.0015 μm and not more than 0.1 μm in thickness.

It is preferred that the lead frame is made of Cu or Fe.

It is preferred that the four-layer plating includes a Ni layer as an undermost layer.

It is preferred that the Ni layer in the four-layer plating is not less than 0.2 μm and not more than 3.0 μm in thickness.

DETAILED DESCRIPTION OF THE INVENTION

Figure 1:
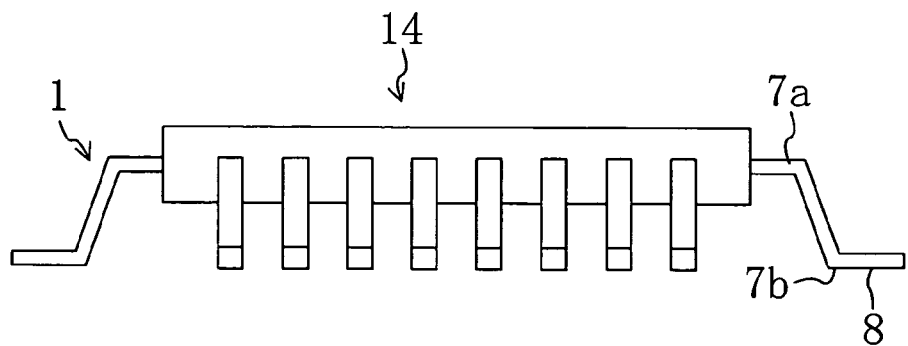
FIG. 1 is a schematic side view of a semiconductor device using a lead frame according to the present invention.

Hereinafter, explanation of an embodiment of the present invention is provided with reference to the drawings. In the drawings, components having substantially the same function are indicated by the same reference numeral for simple explanation.

Figure 2:
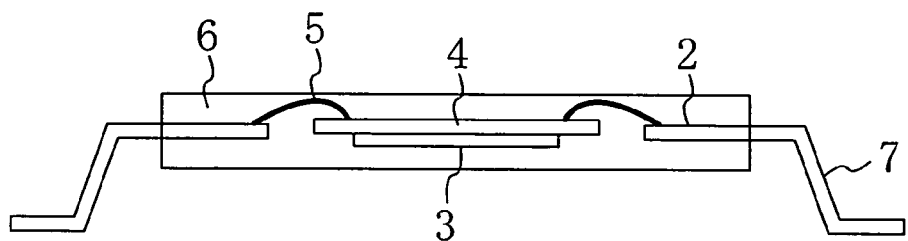
FIG. 2 is a schematic sectional view of the semiconductor device using the lead frame according to the present invention.

FIG. 1 shows a semiconductor device 14 according to an embodiment of the present invention and FIG. 2 is a sectional view thereof. In FIG. 2, hatching is not provided for easy understanding of the structure.

Figure 9A:
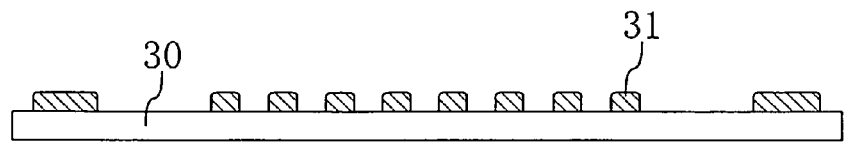
FIGS. 9A to 9C are views illustrating how a semiconductor device is implemented on a board.
Figure 9B:
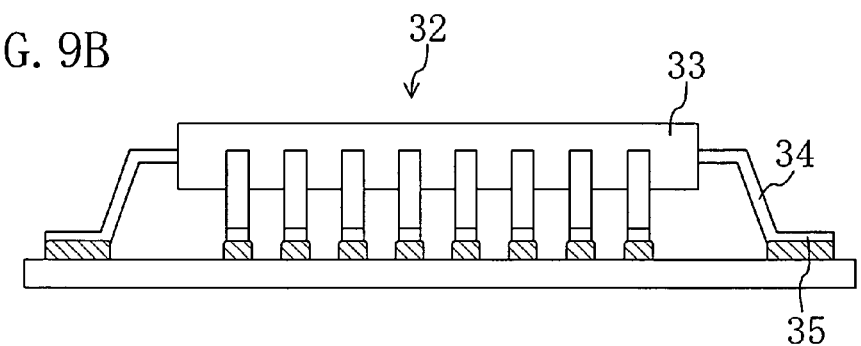
Figure 9C:
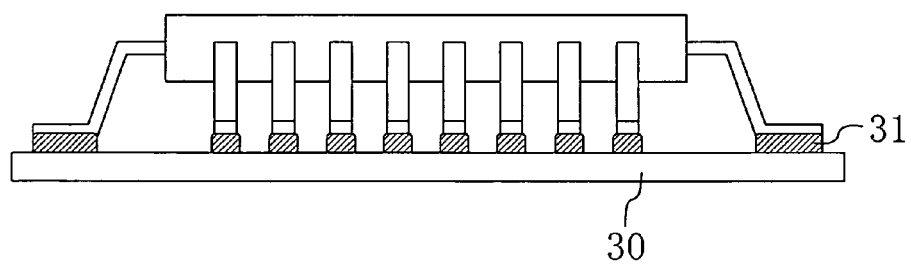
Figure 10:
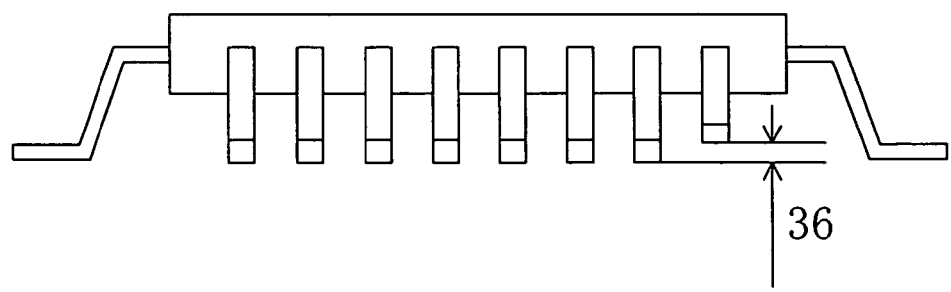
FIG. 10 is a side view of a semiconductor device.
Figure 11:
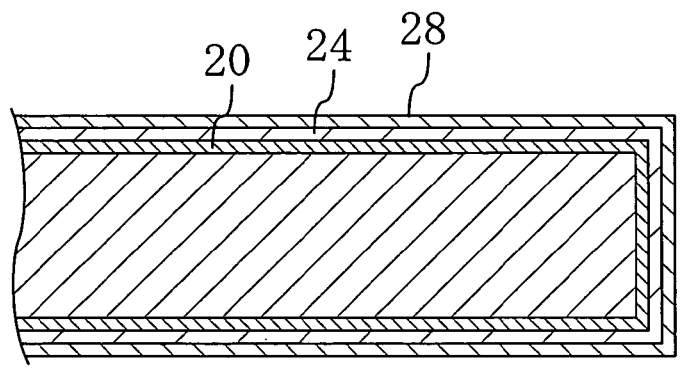
FIG. 11 is a schematic sectional view illustrating the structure of a plating provided on a lead frame in a conventional manner.

A lead frame 1 includes a die pad 3 provided in the middle thereof and inner leads 2 and outer leads 7 surrounding the die pad 3. The inner leads 2 and the outer leads 7 are connected, respectively. The inner leads 2 are electrically connected to electrode pads (not shown) of a semiconductor element 4 mounted on the die pad 3 via thin metal wires 5 and protected by a mold resin 6. Each of the outer leads 7 protruding from the side surface of the mold resin 6 includes two bends, i.e., a first bend 7a closer to the mold resin 6 and a second bend 7b. Part of the outer lead 7 covering from the second bend 7b to the tip of the outer lead 7 has a bottom surface called a mounting surface 8. The outer leads 7 are electrically connected to a printed circuit board (wiring board) 30 via solder paste 31 as shown in FIG. 9C.

In the present embodiment, the outer leads 7 are arranged at a pitch of 500 μm and each of the outer leads 7 has a width of 250 μm. The lead pitch and the lead width are smaller than those disclosed by Japanese Unexamined Patent Publication No. H4-115558.

Figure 3:
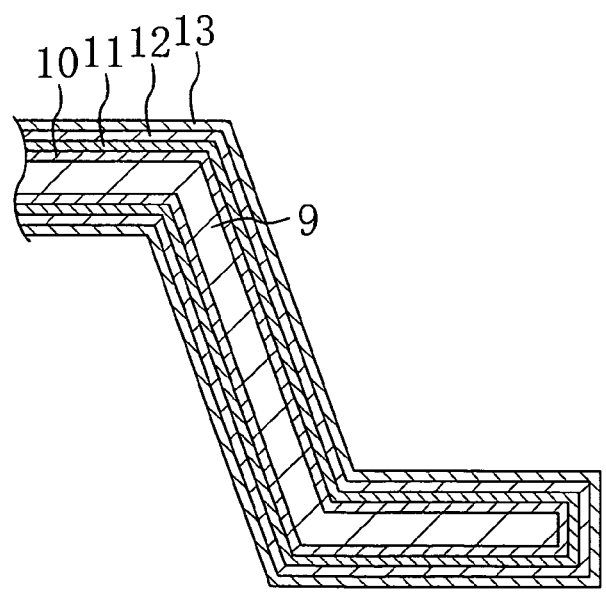
FIG. 3 is a schematic sectional view of an outer lead of the lead frame according to the present invention.

FIG. 3 is an enlarged sectional view of the outer lead 7. In the lead frame 7 of the present embodiment, a 0.15 mm thick lead frame base 9 obtained by pressing or etching a copper alloy is plated through an electrolytic plating line. An underlayer plating 10 (nickel in the present embodiment) is formed as a first layer directly on the lead frame base 9, a palladium (Pd) plating 11 is formed thereon as a second layer, a silver (Ag) plating 12 is formed thereon as a third layer and a gold (Au) plating 13 is formed thereon as a fourth layer. Thus, the outer leads 7 are coated with a four-layer plating made of four different layers, and so are the inner leads 2. The four-layer plating improves wettability with lead free solder paste to a sufficient degree, though the three-layer plating disclosed by Japanese Unexamined Patent Publication No. H4-115558 does not when the lead pitch is reduced. Hereinafter, explanation of the structure of the four-layer plating and suitable thicknesses of the four layers is provided.

The underlayer plating 10 is a nickel plating not less than 0.2 μm and not more than 3.0 μm in thickness. On the nickel coating, the palladium plating 11 not less than 0.005 μm and not more than 0.2 μm in thickness, the silver plating 12 not less than 0.05 μm and not more than 0.5 μm in thickness and the gold plating 13 not less than 0.0015 μm and not more than 0.1 μm in thickness are formed in this order.

Detailed explanation of the four platings is provided below.

The underlayer plating as the first layer is not limited to the nickel plating. The composition and thickness thereof may suitably be selected in consideration of resistance against corrosion of the lead frame base made of a copper alloy or the like, adhesion to the palladium plating as the second layer and cracking of the plating when the lead is bent. From the past experience, Ni and a Ni alloy are preferably used in a thickness of not less than 0.2 μm and not more than 3 μm. Taking characteristic and manufacturing cost into account, the thickness is more preferably not less than 0.5 μm and not more than 2 μm.

The palladium plating as the second layer is provided to inhibit deposition of the underlayer plating and the thickness thereof is determined not to be too large for economical reasons. Therefore, the palladium plating is preferably not less than 0.005 μm and not more than 0.2 μm in thickness. If the thickness of the palladium plating is less than 0.005 μm, it is not preferable because the deposition of the underlayer plating becomes difficult to inhibit. On the other hand, if the thickness of the palladium plating is more than 0.2 μm it is not preferable in terms of cost increase.

As to the third plating, the inventors have conducted various experiments to study the composition and the thickness thereof. The third plating plays an important role in determining the wettability with the solder paste and the quality of wire bonding. As an index of good wicking characteristics of the lead free solder paste, which is of great concern in the art, the inventors of the present invention have conducted measurement of the height of solder fillet lifted toward the outer leads. A greater solder fillet height means greater wicking characteristics. The experiments were carried out using an actual implementation line under the conditions shown in FIG. 4.

Figures 4, 5:
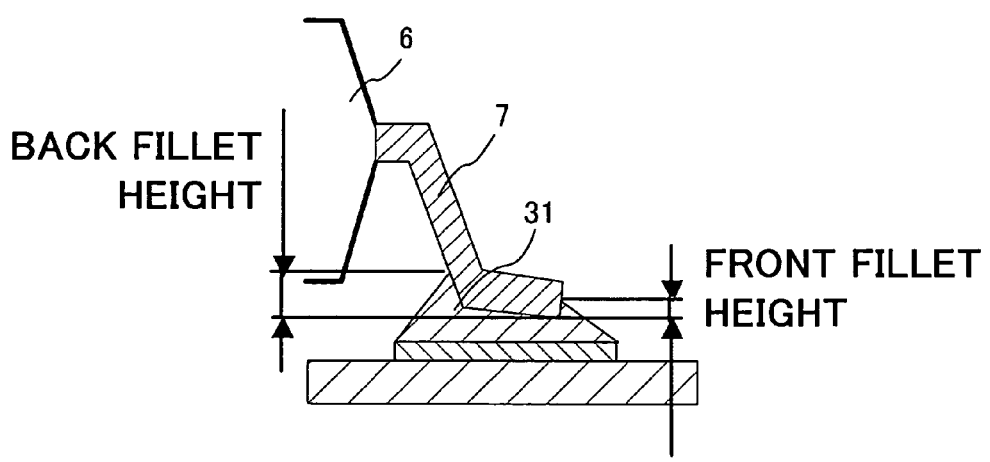
FIG. 4 is a table showing the conditions of an implementation experiment.
FIG. 5 is a schematic view illustrating where the height of solder fillet is measured.

FIG. 5 is a schematic view illustrating where the height of the solder fillet lifted toward the outer leads 7 was measured. Specifically, the height of front fillet generated at the tip of the outer lead 7 (the distance from the edge of the bottom surface of the outer lead 7 to the top end of the solder paste lifted upward to reach the end face of the outer lead 7) was measured and the height of back fillet generated around the second bend 7b (the distance from the edge of the bottom surface of the outer lead 7 to the top end of the solder paste lifted upward to reach a portion above the second bend 7b) was measured. Based on the measurement results, a comparison was made with a comparative three-layer plating made of an underlayer plating (nickel), a palladium plating and a gold plating.

Figure 6:
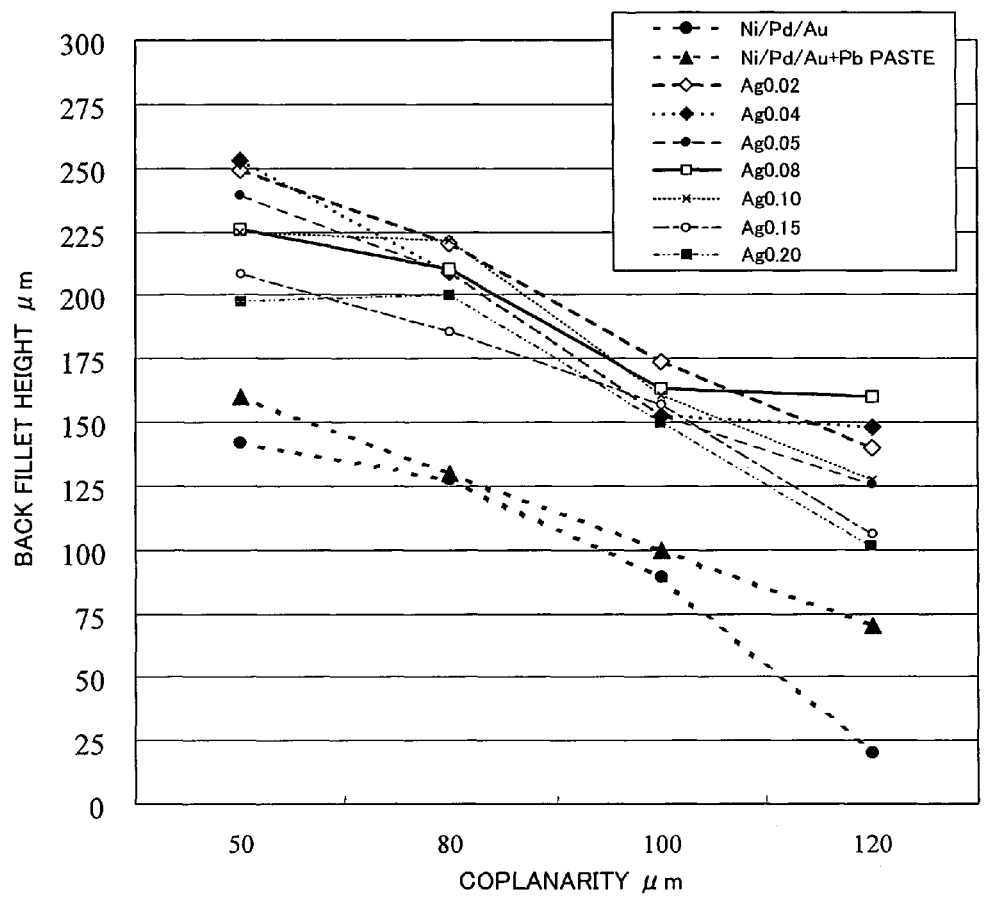
FIG. 6 is a graph illustrating a comparison between the height of back fillet of an embodiment of the invention and that of a comparative embodiment.
Figure 7:
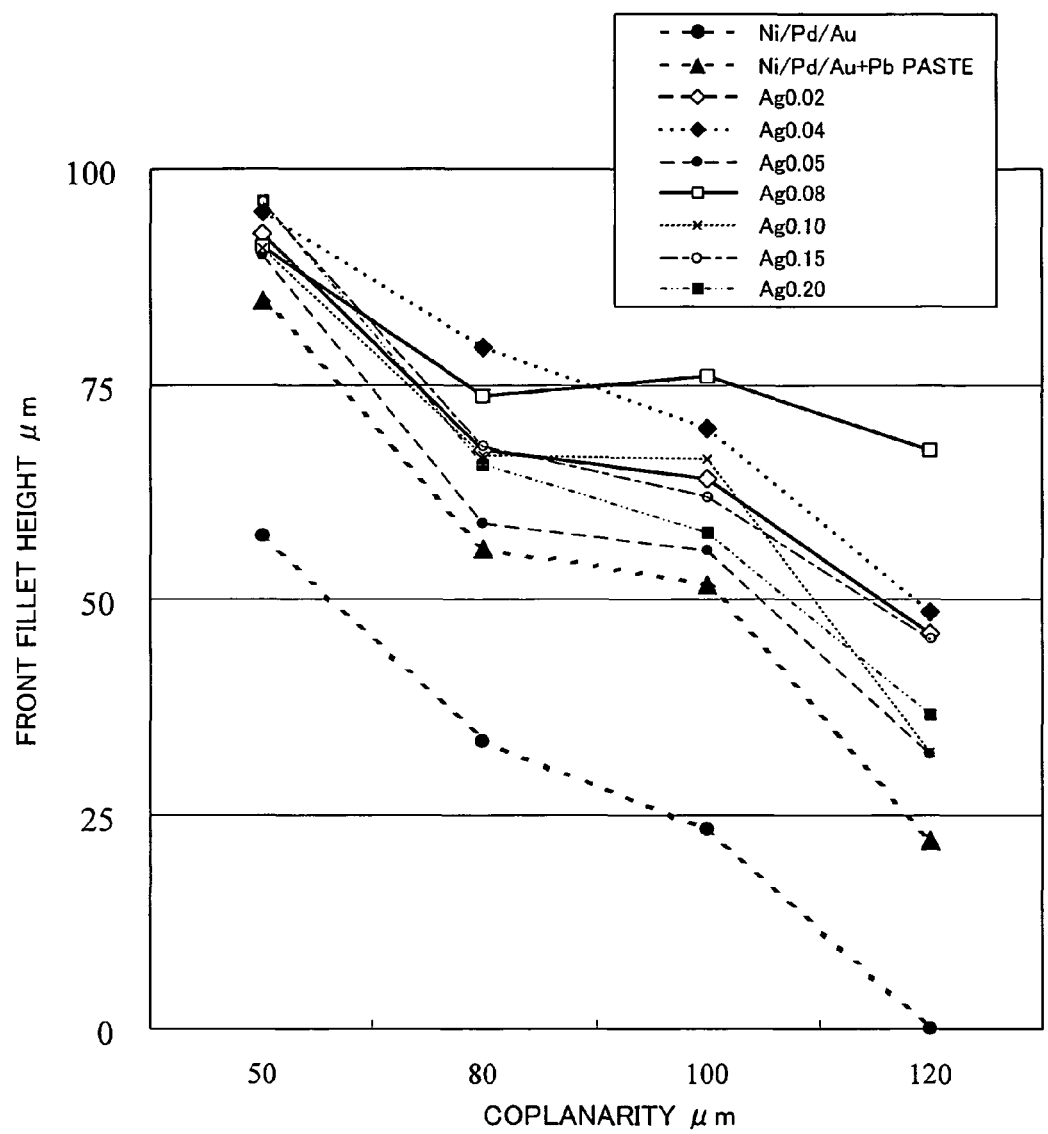
FIG. 7 is a graph illustrating a comparison between the height of front fillet of the embodiment of the invention and that of the comparative embodiment.

FIGS. 6 and 7 are graphs illustrating the fillet height measurement results obtained with the four-layer plating of the present embodiment including a silver plating as the third layer and a gold plating as the fourth layer and the fillet height measurement results obtained with the comparative three-layer plating. As compared with the comparative three-layer plating, the four-layer plating of the present embodiment showed apparent improvement in wettability with the solder. In particular, as compared with a combination of the three-layer plating and the lead-containing solder paste, the four-layer plating of the present embodiment achieved higher wettability with the solder. Further, the wicking characteristics were observed when the thickness of the silver plating was in the range of 0.02 to 0.2 µm. The thickness of the silver plating may be larger than 0.2 µm because the wettability hardly changes if the silver plating is formed thick.

Figure 8:
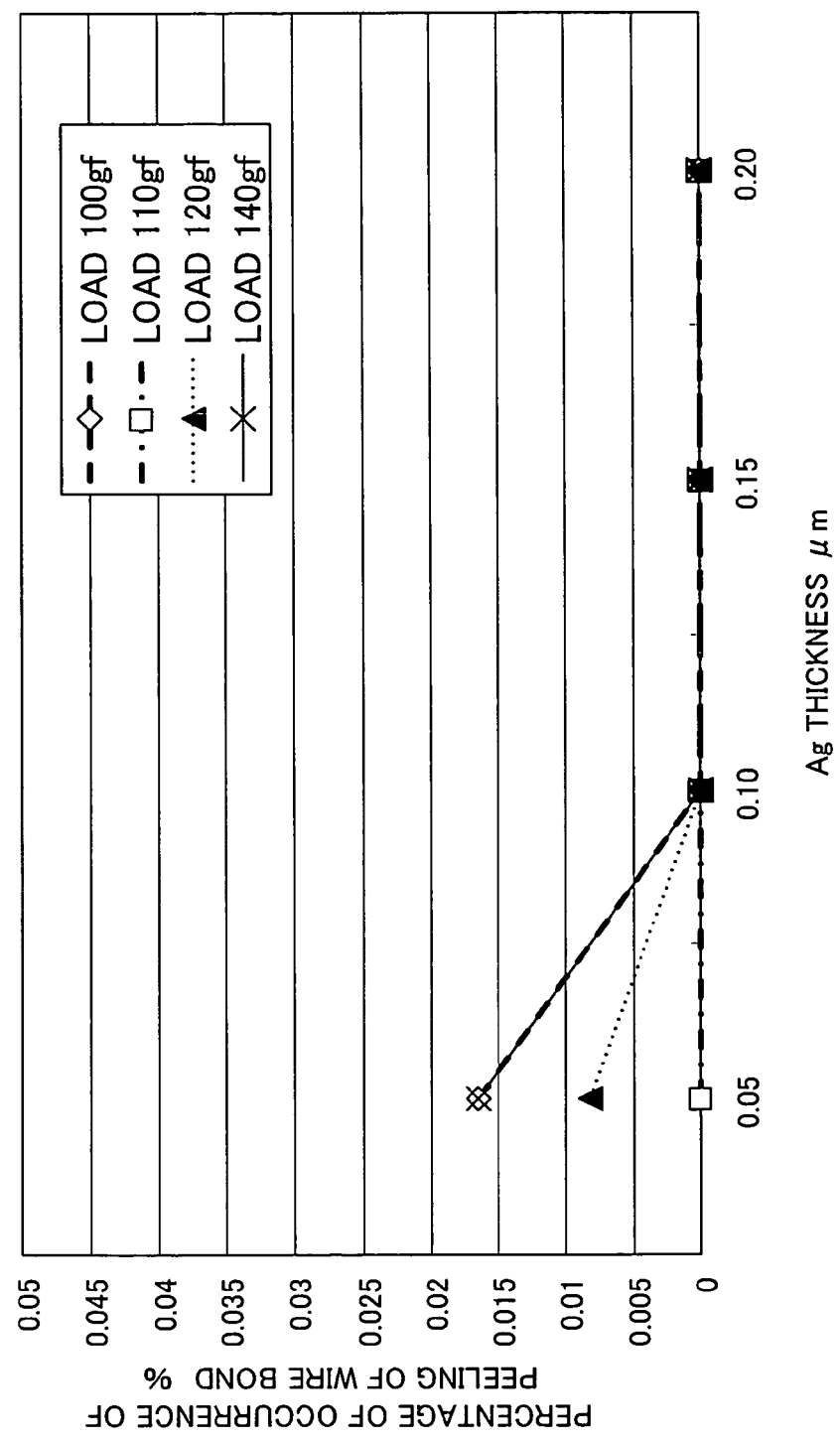
FIG. 8 is a graph illustrating the evaluation results of connection reliability after a wire bonding step.

From the viewpoint of a wire bonding step which is one of the steps for assembling the semiconductor device, it has been found that a thick silver plating makes it possible to improve the reliability of connection established by wire bonding. FIG. 8 is a graph illustrating the evaluation results of reliability of thin metal wire connection established by the wire bonding. The evaluation was made for peeling of a joint between the metal wire and the inner lead. The graph shows that the silver plating not less than 0.1 µm in thickness always keeps the percentage of the occurrence of peeling of wire bond zero even if a bonding load is varied. This makes the bonding condition less severe and improves the connection reliability. Even if the silver plating is 0.05 µm thick, the percentage of the occurrence of peeling of wire bond is low enough to make the bonding condition less severe and improve the connection reliability to a practical degree. In short, the silver plating as the third layer is preferably not less than 0.05 µm in thickness, more preferably not less than 0.1 µm in thickness, at least in the inner leads 2.

Taking the experimental results and the manufacturing cost into account, it is preferred that the silver plating as the third layer is not less than 0.05 µm and not more than 0.5 µm in thickness. From the viewpoint of the wire bonding, the thickness is preferably not less than 0.1 µm and not more than 0.5 µm.

Finally, a study of the gold plating as the fourth layer has been made. The gold plating is configured to be not less than 0.0015 µm and not more than 0.1 µm in thickness almost for economical reasons. If the thickness of the gold plating is less than 0.0015 µm, it is not preferable because the wettability with the solder deteriorates. On the other hand, if the thickness of the gold plating is more than 0.1 µm thick, it is not preferable in terms of cost increase. The gold plating is more preferably not less than 0.003 µm and not more than 0.01 µm in thickness.

In the present embodiment, the four-layer plating described above is formed on the lead frame. Therefore, even if the outer leads 7 are arranged at a pitch as small as 500 µm and each of the outer leads 7 has a width as small as 250 µm, the wettability with the solder paste is satisfactory, thereby obtaining high connection reliability. When the lead pitch and the lead width are reduced, the amount of the corresponding solder paste printed on the wiring board is reduced to deteriorate the reliability of the connection between the outer leads 7 and the wiring board. However, if the plating of the present embodiment is adopted, the connection reliability is kept high. As a result of study on the lead pitch and the lead width of the outer leads 7, it is found that the plating of the present embodiment makes it possible to maintain the high connection reliability between the wiring board with the solder paste printed thereon and the outer leads 7 as long as the pitch is 300 µm or more and the width is 80 µm or more.

The above-described metallic plating is formed using four different plating baths. Referring to the semiconductor device assembly 14 shown in the figures which is a complete assembly, it is needless to say that adjacent layers in the four-layer plating are alloyed with each other due to thermal hysteresis of the assembling step. Therefore, it is possible to convert the thicknesses of the layers into the composition of the alloy, and vise versa. The lead frame 1 may be made of a copper alloy or an iron alloy which has been generally used for the semiconductor products and the thickness thereof is not particularly limited to 0.15 mm.

Japanese Unexamined Patent Publication H4-115558 suggests the problem of migration of the sliver plating. In connection with this, a lead frame provided with the plating of the present embodiment and a comparative lead frame provided with a three-layer plating of Ni/Pd/Au (outermost layer) were examined for reliability under power supply voltage of 6V, temperature of 5 to 25° C. and humidity of 60 to 90%. As a result, their reliabilities were equal and the migration did not occur.

According to the present invention, a metallic plating is provided with good wettability with lead free solder paste which is relatively poor in wicking characteristics. Thus, the present invention eliminates defect factors, such as solder joint open failure and failure in solder fillet formation.

What is claimed is:

1. A lead frame comprising a die pad for mounting a semiconductor element thereon, inner leads electrically connected to electrode pads of the semiconductor element and outer leads connected to the inner leads to function as external terminals, wherein
　　at least both the ends of the respective inner leads and the ends of the respective outer leads opposite to the inner leads are coated with a four-layer plating,
　　first three layers in the four-layer plating from the topmost surface thereof are made of Au, Ag and Pd, respectively,
　　a Au layer made of Au is the topmost layer, and a Ag layer made of Ag is formed between the layer made of Au and a Pd layer made of Pd, and
　　the Ag layer is not less than 0.05 µm and not more than 0.5 µm in thickness.

2. The lead frame of claim 1, wherein
　　the outer leads are arranged at a pitch of not less than 300 µm and not more than 500 µm.

3. The lead frame of claim 1, wherein
　　each of the outer leads is not less than 80 µm and not more than 250 µm in width.

4. The lead frame of claim 1, wherein
the Pd layer in the four-layer plating is not less than 0.005 μm and not more than 0.2 μm in thickness.

5. The lead frame of claim 1, wherein
the Au layer in the four-layer plating is not less than 0.0015 μm and not more than 0.1 μm in thickness.

6. The lead frame of claim 1, wherein
the lead frame is made of Cu or Fe.

7. The lead frame of claim 1, wherein
the four-layer plating consists of the Au layer as the topmost layer, the Ag layer, the Pd layer and a Ni layer as an undermost layer.

8. The lead frame of claim 7, wherein
the Ni layer in the four-layer plating is not less than 0.2 μm and not more than 3.0 μm in thickness.

9. The lead frame of claim 1, wherein the Ag layer is not less than 0.1 μm and not more than 0.5 μm in thickness.

10. The lead frame of claim 9, wherein the entirety of the inner leads and the outer leads are coated with the four-layer plating.

11. A semiconductor device comprising:
the lead frame according to claim 9;
the semiconductor element mounted on the lead frame; and
connecting members electrically connect the inner leads to electrode pads on the semiconductor element,
wherein adjacent layers in the four-layer plating are alloyed with each other.

12. The lead frame of claim 1, wherein the entirety of the inner leads and the outer leads are coated with the four-layer plating.

13. A semiconductor device comprising:
the lead frame according to claim 1;
the semiconductor element mounted on the lead frame; and
connecting members electrically connect the inner leads to electrode pads on the semiconductor element,
wherein adjacent layers in the four-layer plating are alloyed with each other.

* * * * *